(12) United States Patent
Wang (10) Patent No.: US 11,061,440 B1
(45) Date of Patent: Jul. 13, 2021

(54) DEFORMABLE DISPLAY PANEL, MANUFACTURING METHOD THEREOF, AND DISPLAY DEVICE

(71) Applicant: WUHAN CHINA STAR OPTOELECTRONICS SEMICONDUCTOR DISPLAY TECHNOLOGY CO., LTD., Hubei (CN)

(72) Inventor: Lei Wang, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/964,213

(22) PCT Filed: May 6, 2020

(86) PCT No.: PCT/CN2020/088672
§ 371 (c)(1),
(2) Date: Jul. 23, 2020

(51) Int. Cl.
*G09G 5/00* (2006.01)
*G06F 1/16* (2006.01)
*H01L 51/00* (2006.01)
*G09F 9/30* (2006.01)

(52) U.S. Cl.
CPC ............ *G06F 1/1652* (2013.01); *G09F 9/301* (2013.01); *H01L 51/0097* (2013.01)

(58) Field of Classification Search
CPC ....... G09G 2300/0426; G09G 2380/02; G09G 3/3233; H01L 2251/5338; H01L 27/3216; H01L 27/3218; H01L 27/326; H01L 27/3262; H01L 27/3265; H01L 27/1214; H01L 27/1225; H01L 27/323; H01L 29/7869; H01L 51/524; G02F 1/1333; G06F 1/1641; G06F 1/1643; G06F 1/1647; G06F 1/1652; G06F 2203/04102; G06F 3/0445; G06F 3/047; G06F 3/04886
See application file for complete search history.

(56) References Cited

U.S. PATENT DOCUMENTS

| | | | |
|---|---|---|---|
| 2016/0007441 A1* | 1/2016 | Matsueda | H01L 51/0097 361/749 |
| 2017/0069664 A1* | 3/2017 | Nakamura | H01L 27/3293 |

* cited by examiner

*Primary Examiner* — Insa Sadio
(74) *Attorney, Agent, or Firm* — Mark M. Friedman (57) ABSTRACT

A deformable display panel and a manufacturing method thereof are disclosed. The deformable display panel includes display regions, pillar regions, bridge regions, and aperture regions, wherein the pillar regions are disposed around the display regions, and the bridge regions are disposed between the aperture regions and the pillar regions or between the aperture regions; wherein a spaced pillar structure is disposed within each of the pillar regions, and the spaced pillar structure is disposed and spaced apart from the display regions; each of the bridge regions has a bridging structure which is disposed with and spaced apart from the spaced pillar structure.

14 Claims, 7 Drawing Sheets

DEFORMABLE DISPLAY PANEL, MANUFACTURING METHOD THEREOF, AND DISPLAY DEVICE

FIELD DISCLOSURE

The present disclosure relates to the technical field of display panels, and in particular to a deformable display panel, a manufacturing method thereof, and a display device.

BACKGROUND OF DISCLOSURE

With the improvement of display technology, organic light-emitting diodes (OLEDs) capable of flexible display promote the diversification of display and gradually become the mainstream of display technology. In some related technologies, OLED flexible display devices can achieve the bending of the two-dimensional surface, but are not suitable for meeting complicated (e.g. wearable) flexible display requirements.

Because the stretchable OLED display panels have characteristics of unchanged display effects after any deformation, the stretchable OLED display panels can be applied to specific display fields, such as free-form display and wearable devices, and enhance diversity and possibility of the display field in future.

Because the stretchable OLEDs need to be arbitrarily deformable, it is particularly important to realize the design and technological processes of OLED structures, but the corresponding structures and technological processes of the stretchable OLEDs are not disclosed in the prior art.

Therefore, it is necessary to provide a new manufacturing method of the display panel to improve the prior art.

SUMMARY OF INVENTION

Technical Problems

The purpose of the present disclosure is to provide a deformable display panel and a manufacturing method thereof, which can solve the problem that the corresponding structures and technological processes of the stretchable display panels are not disclosed in the prior art.

Technical Solutions

In order to achieve the above purpose, the present disclosure provides a deformable display panel. The deformable display panel includes: a plurality of display regions, a plurality of pillar regions, a plurality of bridge regions, and a plurality of aperture regions, wherein the pillar regions are disposed around the display regions, and the bridge regions are disposed between the aperture regions and the pillar regions or between the aperture regions; wherein a spaced pillar structure is disposed within each of the pillar regions, and the spaced pillar structure is disposed with and spaced apart from the display regions. Each of the bridge regions has a bridging structure which is disposed with and spaced apart from the spaced pillar structure; and wherein each of the display regions has a plurality of display units. The deformable display panel further includes a plurality of signal lines connected from the bridge regions to the display units through the pillar regions.

Further, in other embodiments, the deformable display panel includes: a base layer extended from the display regions to the aperture regions; a stretchable substrate extended from the display regions to the bridge regions; and a barrier layer disposed on the stretchable substrate and extended from the display regions to the bridge regions.

Further, in other embodiments, the deformable display panel includes: a buffer layer disposed on the barrier layer of the display regions; an active layer disposed on the buffer layer of the display regions; a first gate insulating layer disposed on the buffer layer of the display regions and covering the active layer; a first gate layer disposed on the first gate insulating layer of the display regions; an interlayer dielectric layer disposed on the first gate insulating layer of the display regions and covering the first gate layer; and a plurality of through holes passed through the interlayer dielectric layer and the first gate insulating layer. Wherein, the signal lines include a source-drain layer disposed on the interlayer dielectric layer and in the through holes and on the barrier layer of the pillar regions and the bridge regions.

Further, in other embodiments, the deformable display panel further includes: a flat layer disposed on the interlayer dielectric layer of the display regions and the barrier layer of the bridge regions, and covering the signal lines of the bridge regions, wherein in the display regions, the flat layer has an opening corresponding to the source-drain layer. The deformable display panel further includes: an anode layer disposed on a surface of the flat layer of the display regions and the signal lines of the pillar regions, wherein the anode layer extends into the opening and connects the source-drain layer. The deformable display panel further includes: a pixel definition layer disposed on the flat layer of the display regions, the pillar regions, and the bridge regions, and on the anode layer; a photo-spacer barrier layer disposed on the pixel definition layer of the display regions, the pillar regions, and the bridge regions; and an organic light-emitting diodes (OLED) light-emitting layer disposed on the anode layer of the display regions. Wherein, the signal lines further include a cathode layer disposed on the OLED light-emitting layer of the display regions and on the photo-spacer barrier layer of the bridge regions. In the display regions, the buffer layer, the active layer, the first gate insulating layer, the first gate layer, the interlayer dielectric layer, the source-drain layer, the flat layer, the anode layer, the pixel definition layer, the photo-spacer barrier layer, the OLED light-emitting layer, and the cathode layer commonly form the display units. In the pillar regions, the source-drain layer, the anode layer, the pixel definition layer, and the photo-spacer barrier layer commonly form the spaced pillar structure. In the bridge regions, the source-drain layer, the flat layer, the pixel definition layer, the photo-spacer barrier layer, and the cathode layer commonly form the bridging structure; and the cathode layer of the bridge regions and the anode layer of the display regions connect the anode layer of the pillar regions.

Further, in other embodiments, the source-drain layer and the anode layer are entirely in an inverted trapezoidal shape.

In order to achieve the above purpose, the present disclosure provides a manufacturing method for deformable display panel as related in the present disclosure. The deformable display panel includes: a plurality of display regions, a plurality of pillar regions, a plurality of bridge regions, and a plurality of aperture regions, wherein the pillar regions are disposed around the display regions, and the bridge regions are disposed between the aperture regions and the pillar regions or between the aperture regions. The manufacturing method includes steps of: preparing a plurality of display units in the display regions; preparing a plurality of spaced pillar structures in the pillar regions; preparing a plurality of bridging structures in the bridge regions; wherein the spaced pillar structures are disposed with and spaced apart from the display regions; and the bridging structures are disposed with and spaced apart from the spaced pillar structures. The deformable display panel further includes a plurality of signal lines connected from the bridge regions to the display units through the pillar regions.

Further, in other embodiments, the manufacturing method includes steps of: providing a base layer extended form the display regions to the aperture regions; preparing a stretchable substrate extended from the display regions to the aperture regions; and preparing a barrier layer on the stretchable substrate, wherein the barrier layer extends from the display regions to the aperture regions. The manufacturing method includes steps of: preparing a buffer layer on the barrier layer, wherein the buffer layer extends from the display regions to the aperture regions; preparing an active layer on the buffer layer of the display regions; preparing a first gate insulating layer on the buffer layer, wherein the first gate insulating layer covers the active layer and extends from the display regions to the aperture regions; and preparing a first gate layer on the first gate insulating layer of the display regions. The manufacturing method includes steps of: preparing an interlayer dielectric layer on the gate insulating layer, wherein the interlayer dielectric layer covers the first gate layer and extends from the display regions to the aperture regions; and etching the first gate insulating layer and the interlayer dielectric layer of the pillar regions, the bridge regions, the aperture regions, and a part of the display regions, to form a plurality of through holes passed through the interlayer dielectric layer and the first gate insulating layer within the display regions. The manufacturing method includes steps of: etching the buffer layer of the pillar regions, bridge regions, and the aperture regions; and preparing a source-drain layer in the through holes of the display regions and on the barrier layer of the pillar regions and the bridge regions, respectively, wherein the source-drain layers of the display regions, the pillar regions, and bridge regions are disposed with and spaced apart from each other. The manufacturing method includes steps of: etching the barrier layer and the stretchable substrate of the aperture regions; and preparing a flat layer on the interlayer dielectric layer of the display regions and on the barrier layer of the bridge regions, wherein the flat layer covers the source-drain layer of the bridge regions. In the display regions, the flat layer has an opening corresponding to the source-drain layer. Wherein, preparing the flat layer on the bridge area provides a certain capability for subsequent deformation, and not disposing the flat layer on the aperture regions is for subsequent deformation. In other embodiments, the flat layer may also be prepared on the pillar regions mainly based on the subsequently disconnection situation of the cathode to control film stacking. The manufacturing method includes a step of: preparing an anode layer on a surface of the flat layer of the display regions and on the source-drain layer of the pillar regions, wherein the anode layer extends into the opening and connects the source-drain layer. The manufacturing method includes a step of: preparing a pixel definition layer on the flat layer of the display regions, the pillar regions, and the bridge regions, and on the anode layer, wherein preparing the pixel definition layer on the bridge regions may not only protect wire routing of the source-drain layer but also improve the performance of subsequent deformation of the display panel. The manufacturing method includes steps of: preparing a photo-spacer barrier layer on the pixel definition layer of the display regions, the pillar regions, and the bridge regions; and etching a part of the source-drain layer and the anode layer of the pillar regions, so that the source-drain layer and the anode layer of the pillar regions are in an inverted trapezoidal shape which provides conditions for disconnecting a cathode later. For an etching liquid, an etching rate of the source-drain layer is greater than an etching rate of the anode layer, and therefore the source-drain layer and the anode layer of the pillar regions finally form in the inverted trapezoidal shape, which facilitates the cathode subsequently disconnecting here. The cathode may be disconnected here by adjusting the height of the source-drain layer and the anode layer of the pillar regions, and the structure of the inverted trapezoidal shape. Moreover, the spaced pillar structures can also be used as retaining wall structures to block water and oxygen.

Wherein the size of the aperture regions is variable. When the size of the aperture regions varies, the display regions rotate with the variation of the size of the aperture regions.

Further, in other embodiments, a material of the barrier layer is silicon oxide, a material of the first gate insulating layer is silicon oxide or silicon nitride, a material of the gate layer is molybdenum metal, a material of the interlayer dielectric layer is silicon oxide and silicon nitride, wherein silicon nitride of the interlayer dielectric layer can compensate hydrogen, and improve the damage regulating electrical properties of the active layer during the excimer laser annealing (ELA) in a pre-process.

Further, in other embodiments, a material of the source-drain layer is titanium metal or aluminum metal, a material of the flat layer and the pixel definition layer is photoresist. In other embodiments, materials of the flat layer and the pixel definition layer may also be organic materials with high elasticity and corresponding to the modulus of the source-drain layer.

Further, in other embodiments, the photo-spacer barrier layer and the pixel definition layer are prepared by a halftone mask process, so as to save costs.

Further, in other embodiments, the manufacturing method further includes steps of: preparing an OLED light emitting layer on the anode layer of the display regions; and preparing a cathode layer on the OLED light emitting layer of the display regions and on the photo-spacer barrier layer of the bridge regions.

In order to achieve the above purpose, the present disclosure further provides a display device. The display device includes the deformable display panel as related in the present disclosure.

Beneficial Effects:

Compared with the prior art, beneficial effects of the present disclosure are as follows: a deformable display panel, a manufacturing method thereof, and a display device are provided by the present disclosure which discloses the corresponding structures and technological processes of the stretchable display panel, and improves the prior art. Moreover, the present disclosure has high process feasibility, which is convenient for actual production in factories.

BRIEF DESCRIPTION OF DRAWINGS

The technical solutions and beneficial effects thereof will be obvious by the detailed description of the specific embodiments of the present in combination with the drawings below.

The reference numerals in specific embodiments are identified as below:

100. display panel; 101. display regions; 102. pillar regions; 103. bridge regions; 104. aperture regions; 110. display units; 120. spaced pillar structures; 130. bridging structures; 140. signal lines; 10. base layer; 111. stretchable substrate; 112. barrier layer; 113. buffer layer; 114. active layer; 1151. first gate insulating layer; 1161. first gate layer; 1152. second gate insulating layer; 1162. second gate layer; 117. interlayer dielectric layer; 1171. through holes; 141. source-drain layer; 118. flat layer; 119. anode layer; 121. pixel definition layer; 122. photo-spacer layer; 123. OLED light emitting layer; 142. cathode layer.

DETAILED DESCRIPTION OF EMBODIMENTS

In the following description, the technical solutions are clearly and completely described by combining the drawings of embodiments the present disclosure. Obviously, the embodiments described in the following description are only a part of the embodiments of the disclosure, not all the embodiments. Other embodiments obtained from those skilled in the art based on the embodiments of the present disclosure without paying any inventive effort belong to a protected scope of the present disclosure.

It is realized that the direction and position relationship indicated by the terms, such as [central], [longitudinal], [transversal], [lengths], [width], [thickness], [upper], [lower], [front], [post], [left], [right], [vertical], [horizontal], [top], [down], [inside], [outside], [clockwise], and [counter-clockwise], are direction and position relationship based on the drawings of this disclosure. The terms only facilitate describing the present disclosure and simplifying the description, not indicate or imply that the devices or elements must have a specific direction, be configured, and operated in a specific direction. Therefore, the terms should not be realized to limit the present invention. Moreover, the terms "first" and "second" are used for descriptive purposes only, and cannot be realized as indicating or implying relative importance or implying the number of indicated technical features. Thus, the technical features defined as "first" and "second" may explicitly or implicitly include one or more of the technical features. In the description of the present disclosure, a meaning of "a plurality of" is two or more, unless specifically defined.

In the description of the present application, it is noted that the terms "mount", "link", and "connect" should be understood in a broad sense. For example, it may be a fixed connection, a detachable connection, or an integral connection; it may be a mechanical connection, an electrical connection, or it may communicate with each other; it may be a direct connection, or an indirect connection through an intermediate medium, and it may be a connection within two elements or an interaction between two elements. The specific meaning of the above terms in the present disclosure can be understood by a person of ordinary skill in the art based on the specific situations.

Figure 1:
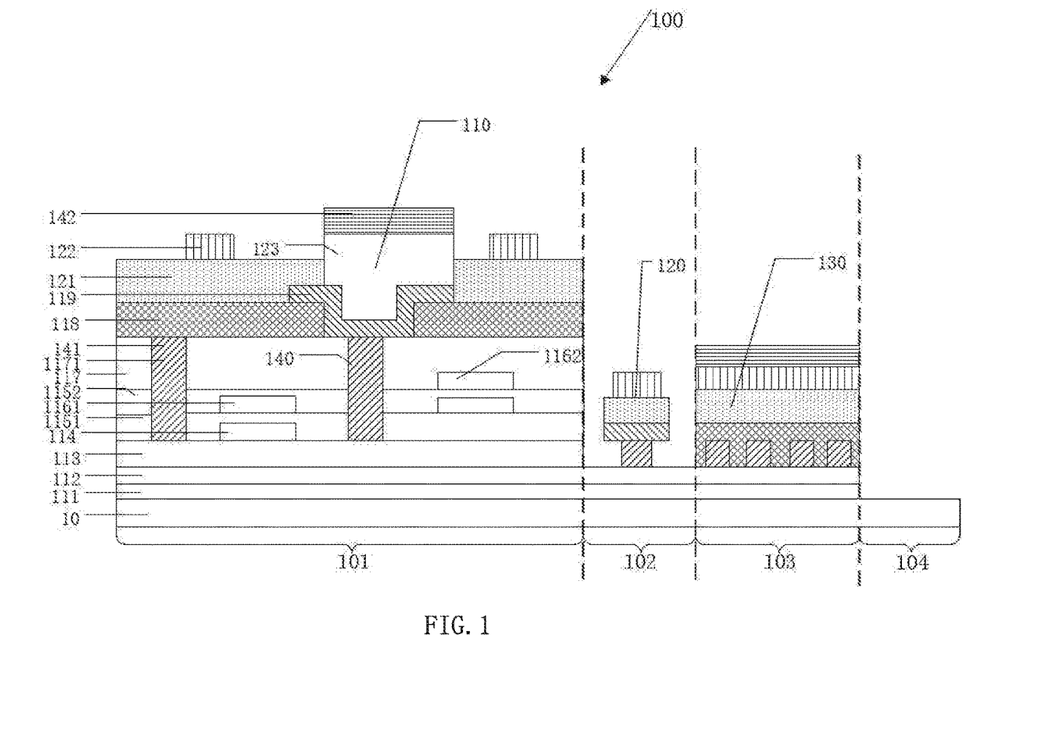
FIG. 1 is a sectional schematic view of a structure of a deformable display panel provided by an embodiment of the present disclosure.
Figure 2:
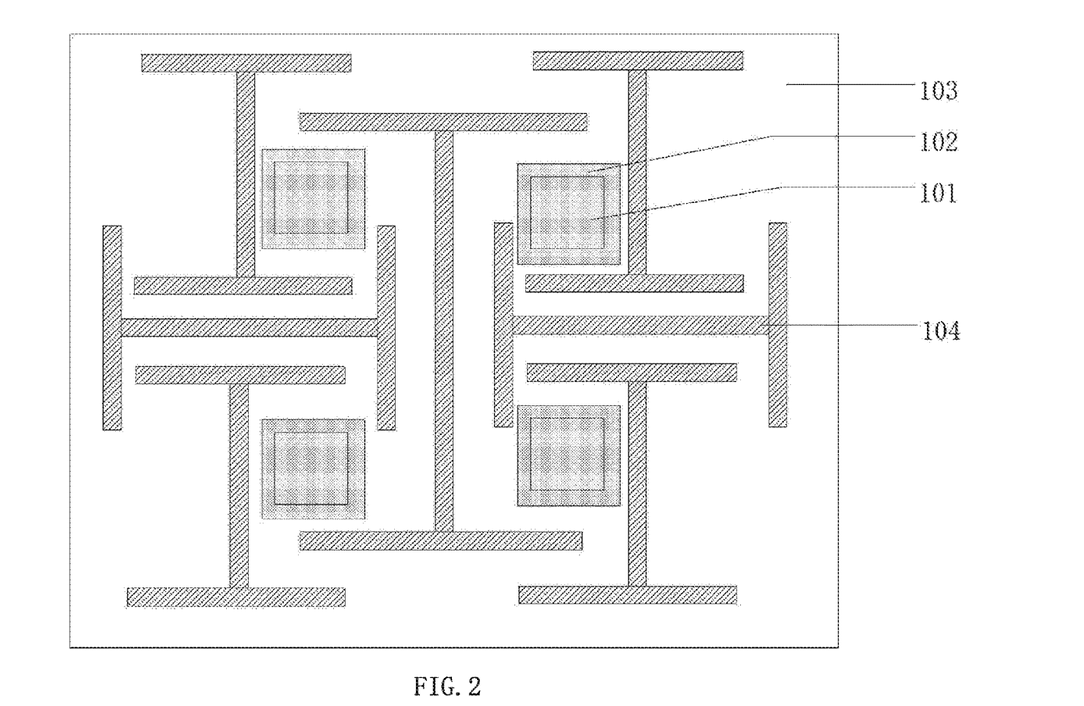
FIG. 2 is a top view of a structure of a deformable display panel provided by an embodiment of the present disclosure.

Specifically, please refer to FIG. 1 and FIG. 2 which are a sectional schematic view of a structure and a top view of a structure of a deformable display 100, respectively. The deformable display panel 100 includes a plurality of display regions 101, a plurality of pillar regions 102, a plurality of bridge regions 103, and a plurality aperture regions 104.

Wherein, the pillar regions 102 are disposed around the display regions 101, and the bridge regions 103 are disposed between the aperture regions 104 and the pillar regions 102 or between the aperture regions 104. Wherein the aperture regions 104 are in a capital I shape.

A spaced pillar structure 120 is disposed within each of the pillar regions 102, and the spaced pillar structure 120 is disposed with and spaced apart from the display regions 103; each of the bridge regions 103 has a bridging structure 130 which is disposed with and spaced apart from the spaced pillar structure 120; and wherein each of the display regions 101 has a plurality of display units 110.

The deformable display panel 100 further includes a plurality of signal lines 140 connected from the bridge regions 103 to the display units 110 through the pillar regions 102.

Specifically, the display panel 100 includes a base layer 10, a stretchable substrate 111, a barrier layer 112, a buffer layer 113, an active layer 114, a first gate insulating layer 1151, a first gate layer 1161, an interlayer dielectric layer 117, a source-drain layer 141, a flat layer 118, an anode layer 119, a pixel definition layer 121, a photo-spacer barrier layer 122, an organic light-emitting diodes (OLED) light-emitting layer 123, and a cathode layer 142.

The base layer 10 extends from the display regions 101 to the aperture regions 104; the stretchable substrate 111 extends from the display regions 101 to the bridge regions 103; and the barrier layer 112 is disposed on the stretchable substrate 111 and extended from the display regions 101 to the bridge regions 103.

The buffer layer 113 is disposed on the barrier layer 112 of the display regions 101; the active layer 114 is disposed on the buffer layer 113 of the display regions 101; the first gate insulating layer 1151 is disposed on the buffer layer 113 of the display regions 101 and covers the active layer 114; and the first gate layer 1161 is disposed on the first gate insulating layer 1151 of the display regions 101. A second gate insulating layer 1152 is disposed on the first gate insulating layer 1151 of the display regions 101 and covers the first gate layer 1161; a second gate layer 1162 is disposed on the second gate insulating layer 1152 of the display regions 101; the interlayer dielectric layer 117 is disposed on the second gate insulating layer 1152 of the display regions and covers the second gate layer 1162. The plurality of through holes 1171 pass through the interlayer dielectric layer 117, the first gate insulating layer 1151, and the second gate insulating layer 1152. Wherein the signal lines 140 include the source-drain layer 141 disposed on the interlayer dielectric layer 117 and in the through holes 1171 and on the barrier layer 112 of the pillar regions 102 and the bridge regions 103.

The flat layer 118 is disposed on the interlayer dielectric layer 117 of the display regions 101 and on the barrier layer 112 of the bridge regions 103, and covers the signal lines 140 of the bridge regions 103. In the display regions 101, the flat layer 118 has an opening corresponding to the source-drain layer 141; an anode layer 119 is disposed on a surface of the flat layer 118 of the display regions 101 and on the signal lines 140 of the pillar regions 102, wherein the anode layer 119 extends into the opening and connects the source-drain layer 141. The pixel definition layer 121 is disposed on the flat layer 118 of the display regions 101, the pillar regions 102, and the bridge regions 103, and on the anode layer 119; the photo-spacer barrier layer 122 is disposed on the pixel definition layer 121 of the display regions 101, the pillar regions 102, and the bridge regions 103; and the OLED light-emitting layer 123 is disposed on the anode layer of the display regions 101. The signal lines 140 further include the cathode layer 142 disposed on the OLED light-emitting layer 123 of the display regions 101 and on the photo-spacer barrier layer 122 of the bridge regions 103.

In the display regions 101, the buffer layer 113, the active layer 114, the first gate insulating layer 1151, the first gate layer 1161, the interlayer dielectric layer 117, the source-drain layer 141, the flat layer 118, the anode layer 119, the pixel definition layer 121, the photo-spacer barrier layer 122, the OLED light-emitting layer 123, and the cathode layer 142 commonly form the display units 110. In the pillar regions 102, the source-drain layer 141, the anode layer 119, the pixel definition layer 121, and the photo-spacer barrier layer 122 commonly form the spaced pillar structures 120. In the bridge regions 103, the source-drain layer 141, the flat layer 118, the pixel definition layer 121, the photo-spacer barrier layer 122, and the cathode layer 142 commonly form the bridging structure 130. The cathode layer 142 of the bridge regions 103 and the anode layer 119 of the display regions 101 connect the anode layer 119 of the pillar regions 102.

Wherein, the source-drain layer 141 and the anode layer 119 are entirely in an inverted trapezoidal shape. This structure is convenient for the cathode to subsequently disconnect here. The cathode may be disconnected at this place by adjusting the height of the source-drain layer 141 and the anode layer 119 of the pillar regions 102, and the structure of the inverted trapezoidal shape. Moreover, the spaced pillar structures can also be used as retaining wall structures to block water and oxygen.

The present embodiment further provides a manufacturing method for the deformable display panel 100 as related in the present embodiment. The deformable display panel 100 includes a plurality of display regions 101, a plurality of pillar regions 102, a plurality of bridge regions 103, and a plurality of aperture regions 104, wherein the pillar regions 102 are disposed around the display regions 101, and the bridge regions 103 are disposed between the aperture regions 104 and the pillar regions 102 or between the aperture regions 104. The manufacturing method includes steps S100-S300. Please refer to FIG. 3, which is a flow chart of the manufacturing method for the deformable display panel provided by the present embodiment.

Figure 3:
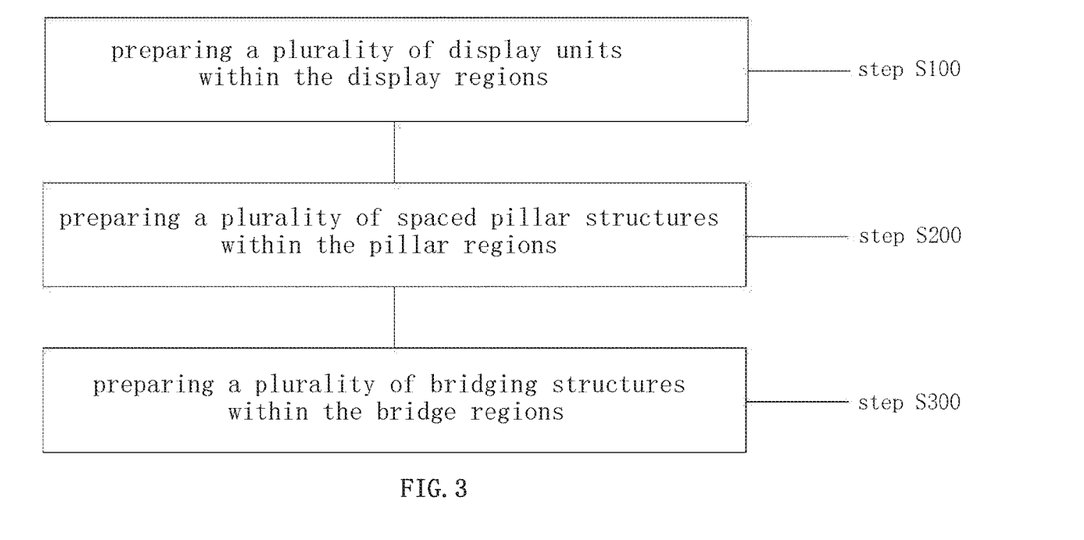
FIG. 3 is a flow chart of a manufacturing method for deformable display panel provided by an embodiment of the present disclosure.

Step S100 relates to preparing a plurality of display units 110 within the display regions 101.

Step S200 relates to preparing a plurality of spaced pillar structures 120 within the pillar regions 102.

Step S300 relates to preparing a plurality of bridging structures 130 within the bridge regions 103.

Wherein, the spaced pillar structures 120 are disposed with and spaced apart from the display regions 101; the bridging structures 130 are disposed with and spaced apart from the spaced pillar structures 120; the deformable display panel 100 further includes a plurality of signal lines 140 connected from the bridge regions 103 to the display units 110 through the pillar regions 102.

The manufacturing method specifically includes steps as below:

Step S1 relates to providing a base layer 10 extended form the display regions 101 to the aperture regions 104.

Step S2 relates to preparing a stretchable substrate 111 extended from the display regions 101 to the aperture regions 104.

Step S3 relates to preparing a barrier layer 112 on the stretchable substrate 111, wherein the barrier layer 112 extends from the display regions 101 to the aperture regions 104, wherein a material of the barrier layer 112 is silicon oxide.

Step S4 relates to preparing a buffer layer 113 on the barrier layer 112, wherein the buffer layer 113 extends from the display regions 101 to the aperture regions 104.

Step S5 relates to preparing an active layer 114 on the buffer layer 113 of the display regions 101.

Step S6 relates to preparing a first gate insulating layer 1151 on the buffer layer 113, wherein the first gate insulating layer 1151 covers the active layer 114 and extends from the display regions 101 to the aperture regions 104.

Step S7 relates to preparing a first gate layer 1161 on the first gate insulating layer 1151 of the display regions 101, wherein a material of the first gate insulating layer 1151 is silicon oxide or silicon nitride, and a material of the first gate layer 1161 is molybdenum metal.

Step S8 relates to preparing a second gate insulating layer 1152 of the buffer layer 113, wherein the second gate insulating layer 1152 extends from the display regions 101 to the aperture regions 104.

Figure 4:
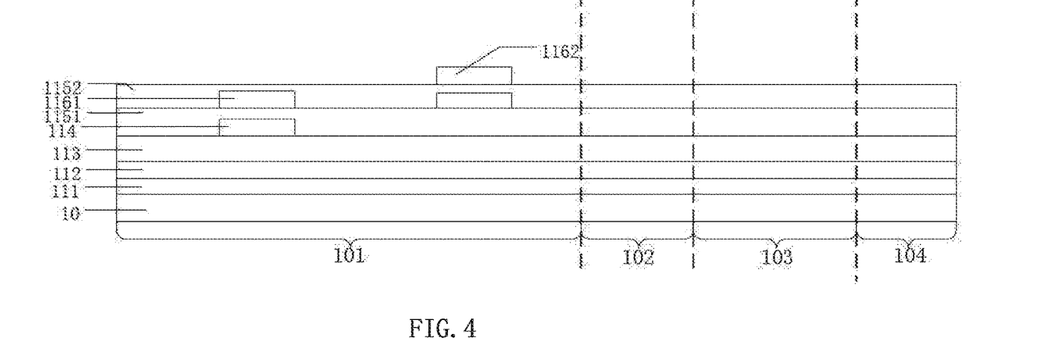
FIG. 4 is a schematic view of a structure of a display panel provided by an embodiment of the present disclosure in step S9 of the manufacturing method for deformable display.

Step S9 relates to preparing a second gate layer 1162 on the second gate insulating layer 1152. Please refer to FIG. 4, which is a schematic view of a structure of the display panel provided by the present embodiment in step S9 of the manufacturing method for deformable display.

Wherein a material of the second gate insulating layer 1152 is silicon oxide or silicon nitride, and a material of the second gate layer 1162 is molybdenum metal.

Figure 5:
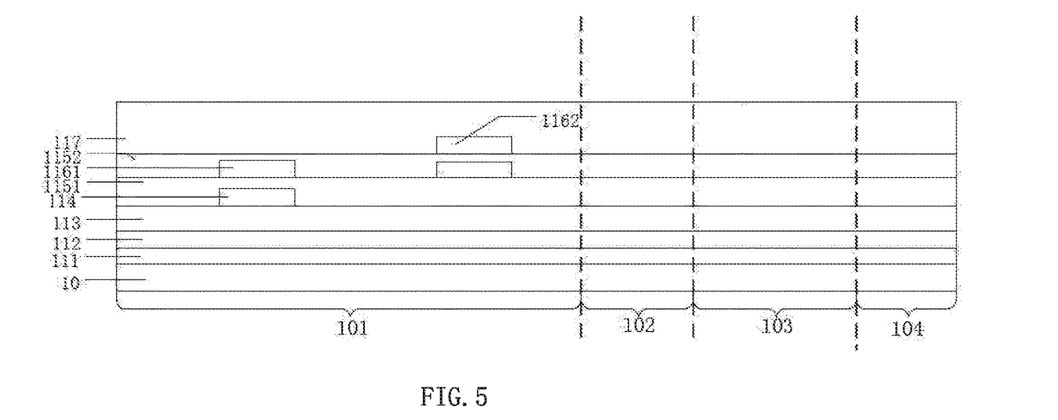
FIG. 5 is a schematic view of a structure of a display panel provided by an embodiment of the present disclosure in step S10 of the manufacturing method for deformable display.

Step S10 relates to preparing an interlayer dielectric layer 117 on the second gate insulating layer 1152, wherein the interlayer dielectric layer 117 covers the second gate layer 1162 and extends from the display regions 101 to the aperture regions 104. Please refer to FIG. 5, which is a schematic view of a structure of the display panel provided by the present embodiment in step S10 of the manufacturing method for deformable display.

Wherein a material of the interlayer dielectric layer 117 is silicon oxide or silicon nitride, wherein silicon nitride of the interlayer dielectric layer 117 can compensate hydrogen, and improve the damage regulating electrical properties of the active layer during the excimer laser annealing (ELA) in a pre-process.

Figure 6:
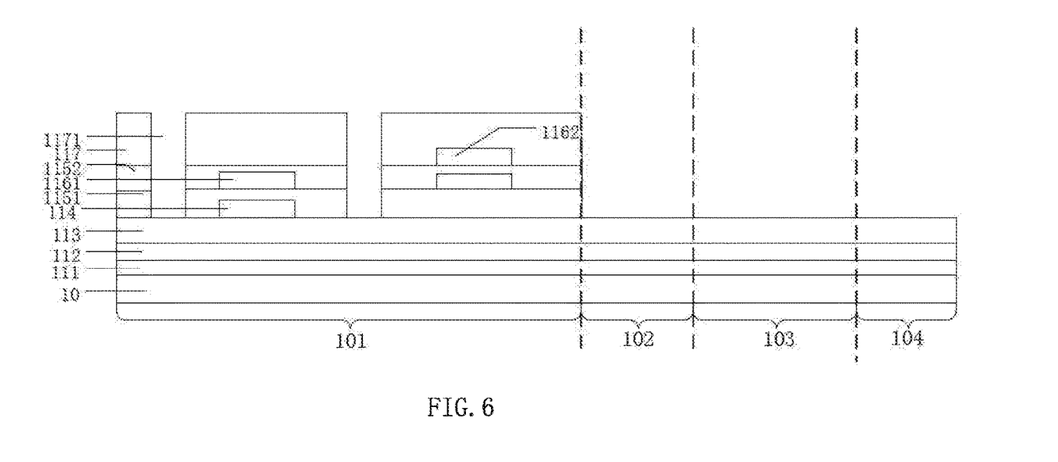
FIG. 6 is a schematic view of a structure of a display panel provided by an embodiment of the present disclosure in step S11 of the manufacturing method for deformable display.

Step S11 relates to etching the first gate insulating layer 1151, the interlayer dielectric layer 117, and the second gate insulating layer 1152 of the pillar regions 102, the bridge regions 103, the aperture regions 104, and a part of the display regions, to form a plurality of through holes 1171 passed through the interlayer dielectric layer 117, the second gate insulating layer 1152, and the first gate insulating layer 1151 within the display regions 101. Please refer to FIG. 6, which is a schematic view of a structure of the display panel provided by the present embodiment in step S1*l* of the manufacturing method for deformable display.

Figure 7:
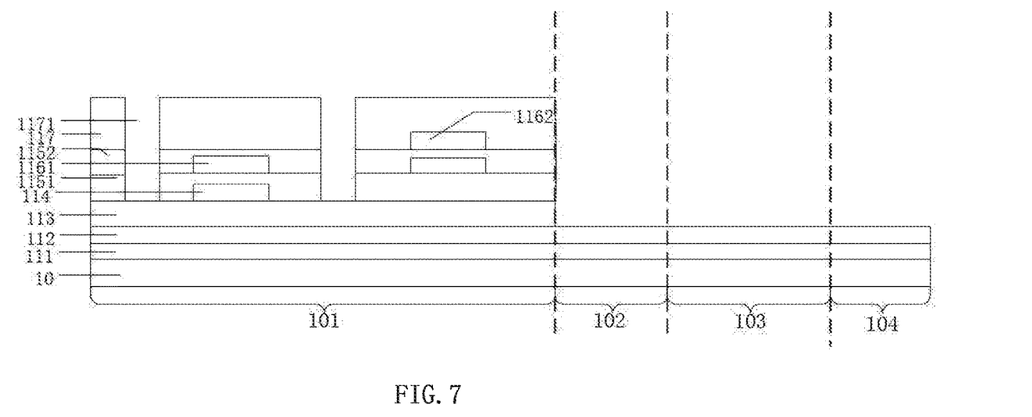
FIG. 7 is a schematic view of a structure of a display panel provided by an embodiment of the present disclosure in step S12 of the manufacturing method for deformable display.

Step S12 relates to etching the buffer layer 113 of the pillar regions 102, the bridge regions 103, and the aperture regions 104. Please refer to FIG. 7, which is a schematic view of a structure of the display panel provided by the present embodiment in step S12 of the manufacturing method for deformable display.

Figure 8:
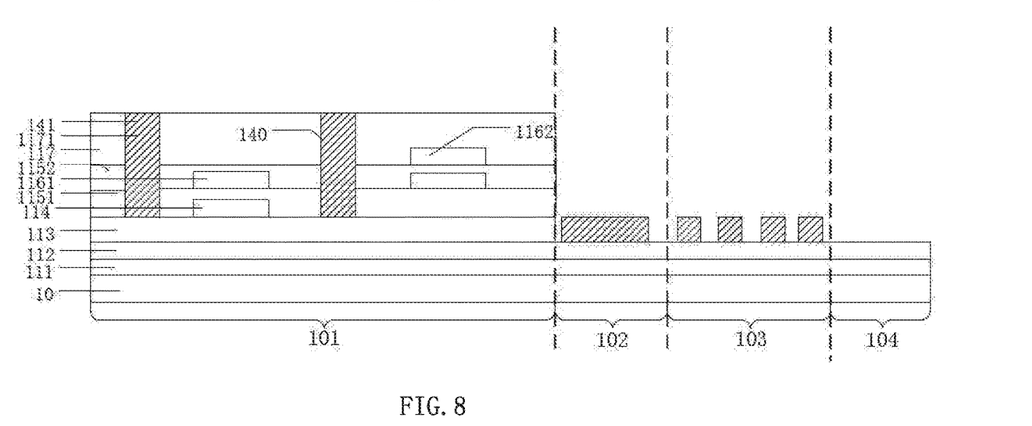
FIG. 8 is a schematic view of a structure of a display panel provided by an embodiment of the present disclosure in step S13 of the manufacturing method for deformable display.

Step S13 relates to preparing a source-drain layer 141 in the through holes 1171 of the display regions 101 and on the barrier layer 112 of the pillar regions 102 and the bridge regions 103, respectively, wherein the source-drain layers 141 of the display regions 101, the pillar regions 102, and bridge regions 103 are disposed and spaced apart from each other. Please refer to FIG. 8, which is a schematic view of a structure of the display panel provided by the present embodiment in step S13 of the manufacturing method for deformable display.

Wherein a material of the source-drain layer 141 is titanium metal or aluminum metal.

Figure 9:
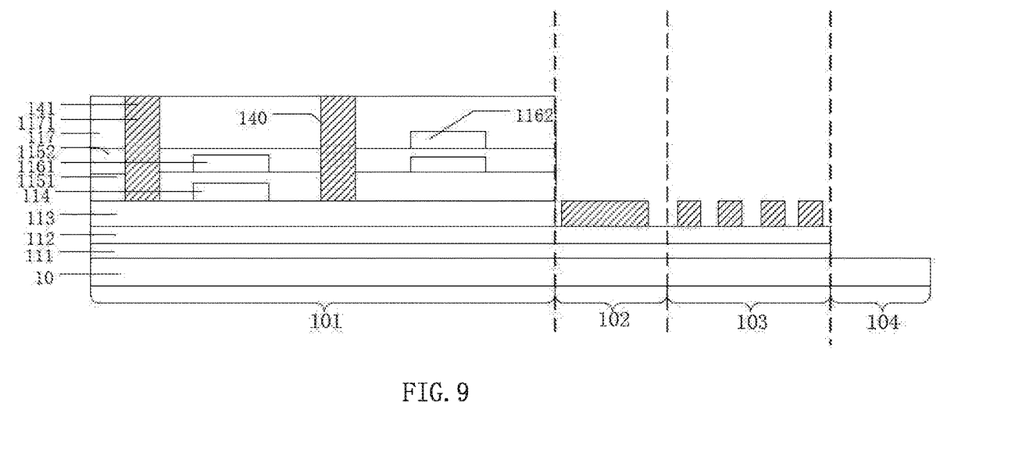
FIG. 9 is a schematic view of a structure of a display panel provided by an embodiment of the present disclosure in step S14 of the manufacturing method for deformable display.

Step S14 relates to etching the barrier layer 112 and the stretchable substrate 111 of the aperture regions 104. Please refer to FIG. 9, which is a schematic view of a structure of the display panel provided by the present embodiment in step S14 of the manufacturing method for deformable display.

Figure 10:
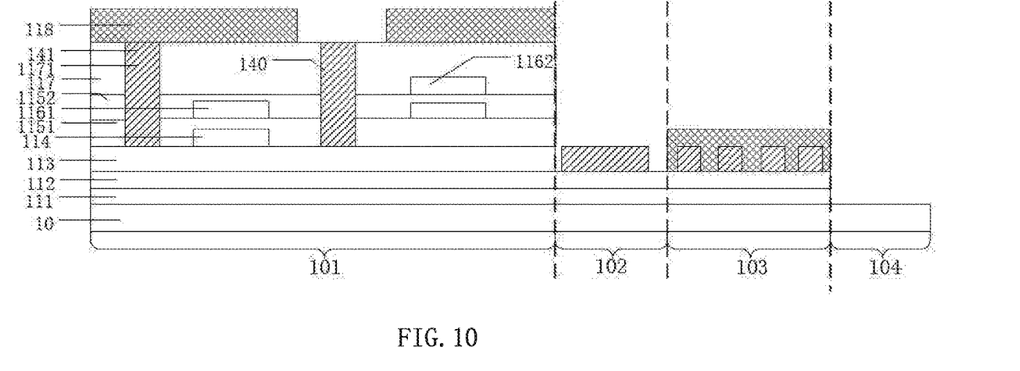
FIG. 10 is a schematic view of a structure of a display panel provided by an embodiment of the present disclosure in step S15 of the manufacturing method for deformable display.

Step S15 relates to preparing a flat layer 118 on the interlayer dielectric layer 117 of the display regions 101 and on the barrier layer 112 of the bridge regions 103, wherein the flat layer 118 covers the source-drain layer 141 of the bridge regions 103, and in the display regions 101, the flat layer 118 has an opening corresponding to the source-drain layer 141. Please refer to FIG. 10, which is a schematic view of a structure of the display panel provided by the present embodiment in step S15 of the manufacturing method for deformable display.

Wherein preparing the flat layer 118 on the bridge area 103 provides a certain capability for subsequent deformation, and not disposing the flat layer 118 on the aperture regions 104 is for subsequent deformation. In other embodiments, the flat layer 118 may also be prepared on the pillar regions 102 mainly based on the subsequently disconnecting situation of the cathode to control film stacking.

Figure 11:
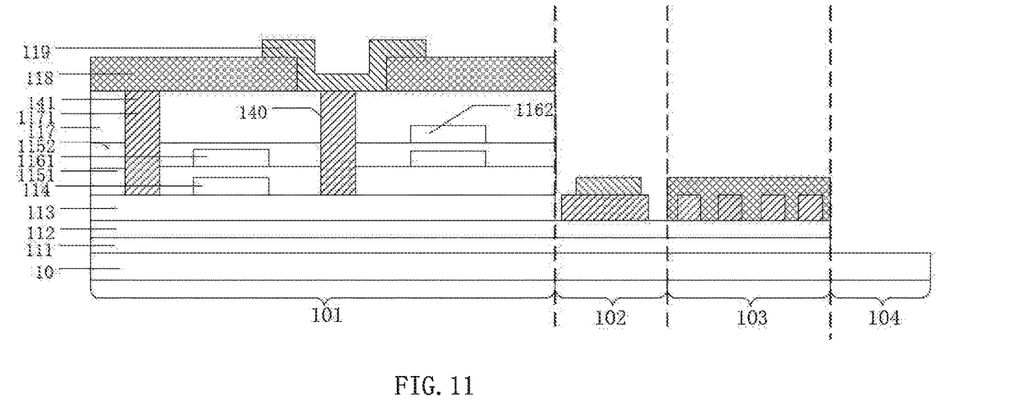
FIG. 11 is a schematic view of a structure of a display panel provided by an embodiment of the present disclosure in step S16 of the manufacturing method for deformable display.

Step S16 relates to preparing an anode layer 119 on a surface of the flat layer 118 of the display regions 101 and on the source-drain layer 141 of the pillar regions 102, wherein the anode layer 119 extends into the opening and connects the source-drain layer 141. Please refer to FIG. 11, which is a schematic view of a structure of the display panel provided by the present embodiment in step S16 of the manufacturing method for deformable display.

Figure 12:
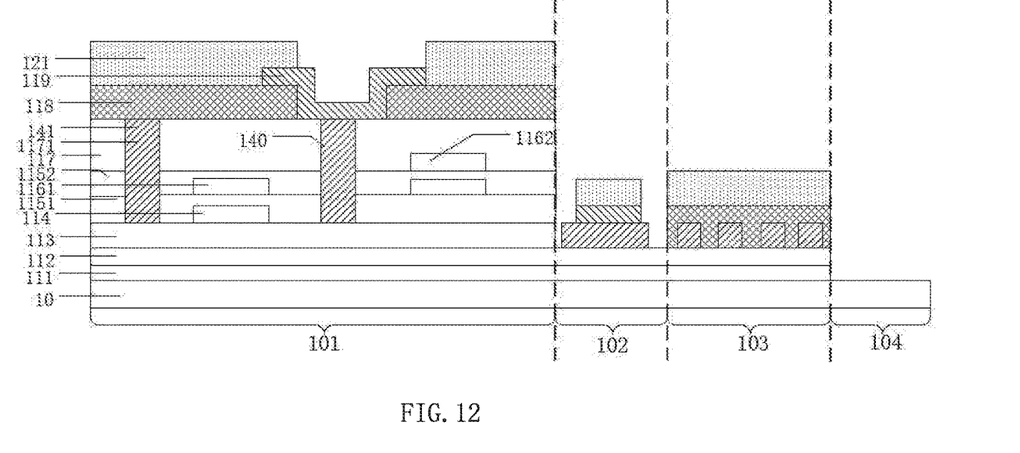
FIG. 12 is a schematic view of a structure of a display panel provided by an embodiment of the present disclosure in step S17 of the manufacturing method for deformable display.

Step S17 relates to preparing a pixel definition layer 121 on the flat layer 118 of the display regions 101, the pillar regions 102, and the bridge regions 103, and on the anode layer 119. Please refer to FIG. 12, which is a schematic view of a structure of the display panel provided by the present embodiment in step S17 of the manufacturing method for deformable display.

Wherein preparing the pixel definition layer 121 on the bridge regions 103 may not only protect wire routing of the source-drain layer 141 but also improve the performance of subsequent deformation of the display panel 100.

Wherein a material of the flat layer 118 and the pixel definition layer 121 is photoresist. In other embodiments, materials of the flat layer 118 and the pixel definition layer 121 may also be organic materials with high elasticity and corresponding to the modulus of the source-drain layer 141.

Figure 13:
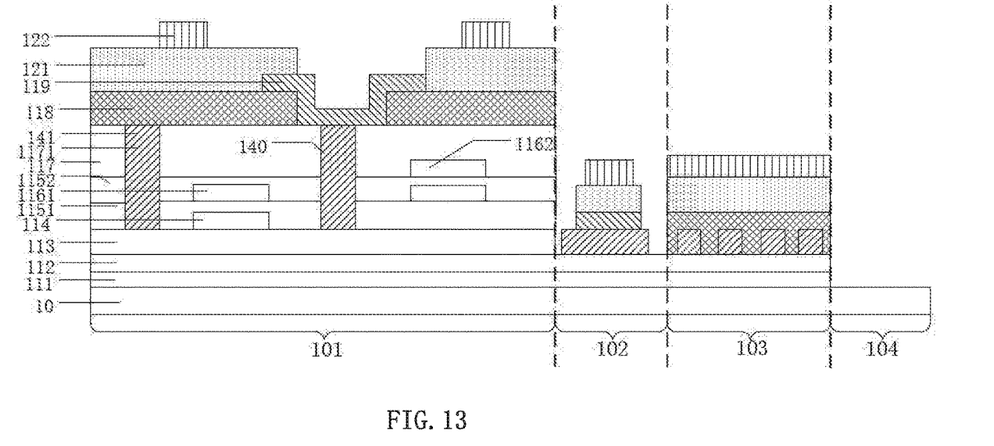
FIG. 13 is a schematic view of a structure of a display panel provided by an embodiment of the present disclosure in step S18 of the manufacturing method for deformable display.

Step S18 relates to preparing a photo-spacer barrier layer 122 on the pixel definition layer 121 of the display regions 101, the pillar regions 102, and the bridge regions 103. Please refer to FIG. 13, which is a schematic view of a structure of the display panel provided by the present embodiment in step S18 of the manufacturing method for deformable display.

Wherein the photo-spacer barrier layer 122 and the pixel definition layer 121 are prepared by a halftone mask process, so as to save costs.

Step S19 relates to etching a part of the source-drain layer 141 and the anode layer 119 of the pillar regions 102, so that the source-drain layer 141 and the anode layer 119 of the pillar regions 102 are in an inverted trapezoidal shape, which provides conditions for subsequently disconnecting the cathode. Please refer to FIG. 14, which is a schematic view of a structure of the display panel provided by the present embodiment in step S19 of the manufacturing method for deformable display.

Figure 14:
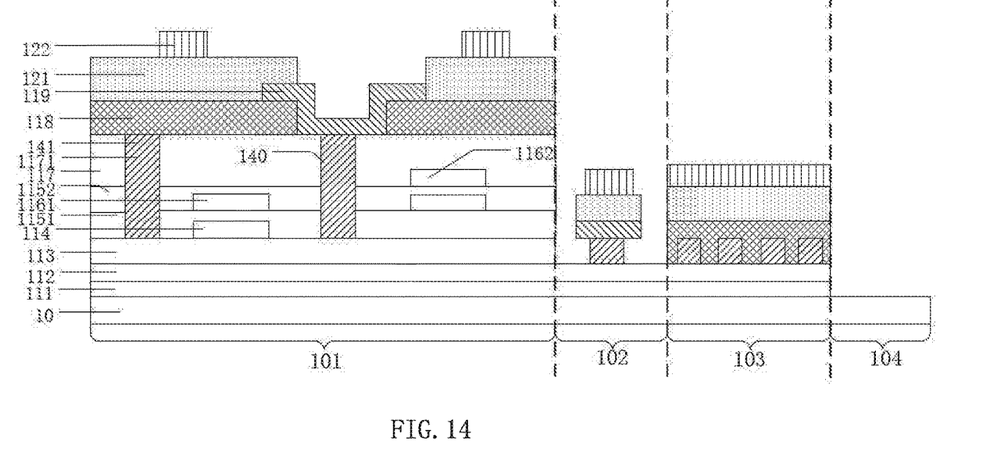
FIG. 14 is a schematic view of a structure of a display panel provided by an embodiment of the present disclosure in step S19 of the manufacturing method for deformable display.

For an etching liquid, an etching rate of the source-drain layer 141 is greater than an etching rate of the anode layer 119, and therefore the source-drain layer 141 and the anode layer 119 of the pillar regions 102 finally form in the inverted trapezoidal shape, which facilitates the cathode subsequently disconnecting here. The cathode may be disconnected here by adjusting the height of the source-drain layer 141 and the anode layer 119 of the pillar regions 102, and the structure of the inverted trapezoidal shape. Moreover, the spaced pillar structures 120 can also be used as retaining wall structures to block water and oxygen.

Figure 15:
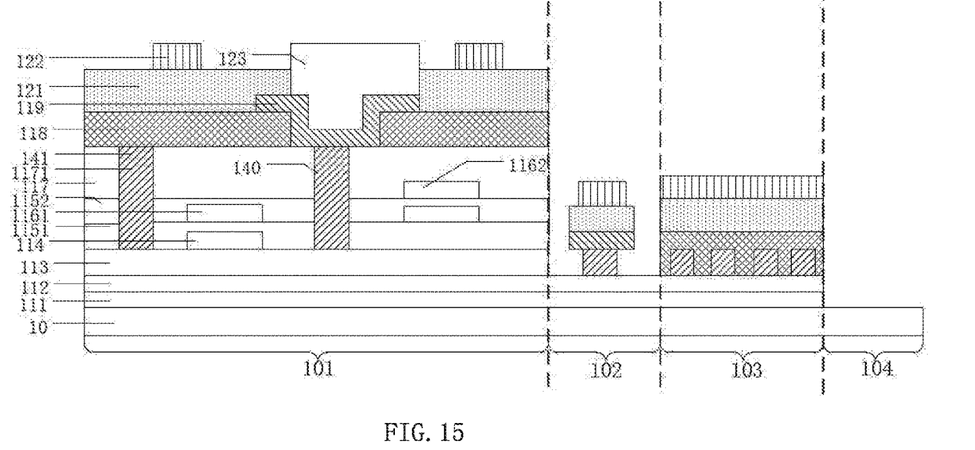
FIG. 15 is a schematic view of a structure of a display panel provided by an embodiment of the present disclosure in step S20 of the manufacturing method for deformable display.

Step S20 relates to preparing an OLED light emitting layer 123 on the anode of the display regions 101. Please refer to FIG. 15, which is a schematic view of a structure of the display panel provided by the present embodiment in step S20 of the manufacturing method for deformable display.

Figure 16:
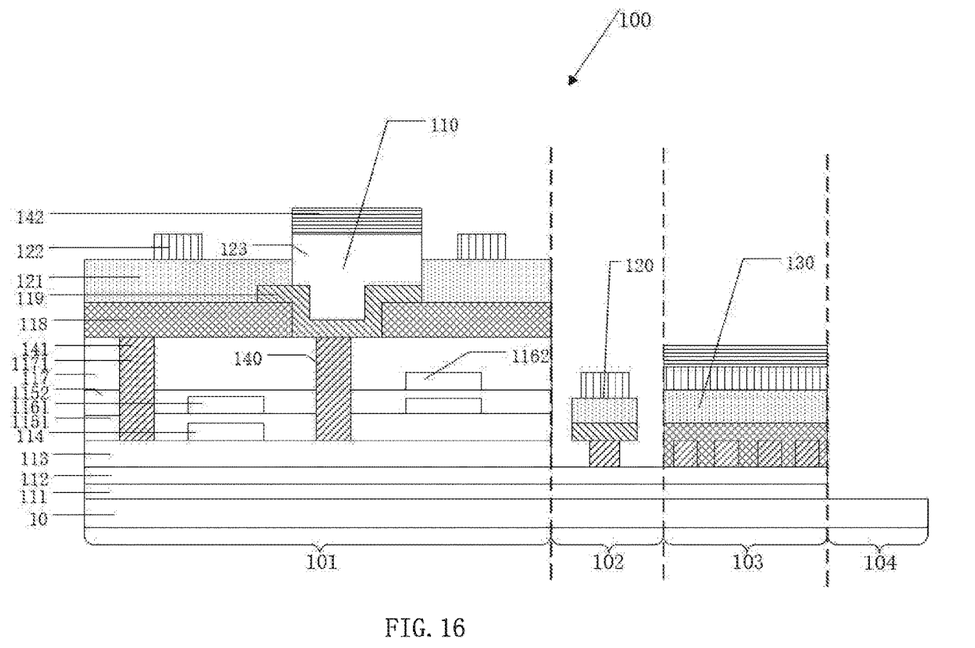
FIG. 16 is a schematic view of a structure of a display panel provided by an embodiment of the present disclosure in step S21 of the manufacturing method for deformable display.

Step S21 relates to preparing a cathode layer 142 on the OLED light emitting layer 123 of the display regions 101 and on the photo-spacer barrier layer 122 of the bridge regions 103. Please refer to FIG. 16, which is a schematic view of a structure of the display panel provided by the present embodiment in step S21 of the manufacturing method for deformable display.

Wherein the size of the aperture regions 104 is variable. When the size of the aperture regions 104 varies, the display regions 101 rotate with the variation of the size of the aperture regions 104.

The embodiment further provides a display device, including the deformable display panel 100 related in the present disclosure.

The beneficial effects of the present disclosure are as follows: a deformable display panel, a manufacturing method thereof, and a display device are provided by the present disclosure. The present disclosure discloses the corresponding structures and technological processes of the stretchable display panel, improves the prior art, and has high feasibility of the process, which is convenient for actual production in factories.

In the embodiments above, the description of each embodiment has its own emphasis. For a part that is not specifically described in a certain embodiment, please refer to the relevant description of other embodiments.

The deformable display panel, the manufacturing method thereof, and the display device provided by the embodiments of the present disclosure are described in detail as above. The principles and embodiments of the present disclosure are described in the specific examples. The description of the embodiments is only for helping understand the technical solutions and its core idea of the present disclosure. It should be understood by those skilled in the art that they can still modify the technical solutions described in the above embodiments or equivalently replace some of the technical features, and these modifications or replacements do not depart from the scope of the technical solutions of the embodiments of the present disclosure.

What is claimed is:

1. A deformable display panel, comprising: a plurality of display regions, a plurality of pillar regions, a plurality of bridge regions, and a plurality of aperture regions, wherein the pillar regions are disposed around the display regions, and the bridge regions are disposed between the aperture regions and the pillar regions or between the aperture regions;
   wherein a spaced pillar structure is disposed within each of the pillar regions, and the spaced pillar structure is disposed with and spaced apart from the display regions;
   each of the bridge regions has a bridging structure which is disposed with and spaced apart from the spaced pillar structure; and
   wherein each of the display regions has a plurality of display units, the deformable display panel further comprises a plurality of signal lines connected from the bridge regions to the display units through the pillar regions.

2. The deformable display panel as claimed in claim 1, wherein the deformable display panel comprises:
   a base layer extended from the display regions to the aperture regions;
   a stretchable substrate extended from the display regions to the bridge regions; and
   a barrier layer disposed on the stretchable substrate and extended from the display regions to the bridge regions.

3. The deformable display panel as claimed in claim 2, wherein the deformable display panel comprises:

a buffer layer disposed on the barrier layer of the display regions;
   an active layer disposed on the buffer layer of the display regions;
   a first gate insulating layer disposed on the buffer layer of the display regions and covering the active layer;
   a first gate layer disposed on the first gate insulating layer of the display regions;
   an interlayer dielectric layer disposed on the first gate insulating layer of the display regions and covering the first gate layer; and
   a plurality of through holes passed through the interlayer dielectric layer and the first gate insulating layer;
   wherein the signal lines comprise a source-drain layer disposed on the interlayer dielectric layer and in the through holes and on the barrier layer of the pillar regions and the bridge regions.

4. The deformable display panel as claimed in claim 3, wherein the deformable display panel further comprises:
   a flat layer disposed on the interlayer dielectric layer of the display regions and the barrier layer of the bridge regions, and covering the signal lines of the bridge regions, wherein in the display regions, the flat layer has an opening corresponding to the source-drain layer;
   an anode layer disposed on a surface of the flat layer of the display regions and the signal lines of the pillar regions, wherein the anode layer extends into the opening and connects the source-drain layer;
   a pixel definition layer disposed on the flat layer of the display regions, the pillar regions, and the bridge regions, and on the anode layer;
   a photo-spacer barrier layer disposed on the pixel definition layer of the display regions, the pillar regions, and the bridge regions; and
   an organic light-emitting diode (OLED) light-emitting layer disposed on the anode layer of the display regions;
   wherein the signal lines further comprise a cathode layer disposed on the OLED light-emitting layer of the display regions and on the photo-spacer barrier layer of the bridge regions;
   in the display regions, the buffer layer, the active layer, the first gate insulating layer, the first gate layer, the interlayer dielectric layer, the source-drain layer, the flat layer, the anode layer, the pixel definition layer, the photo-spacer barrier layer, the OLED light-emitting layer, and the cathode layer commonly form the display units;
   in the pillar regions, the source-drain layer, the anode layer, the pixel definition layer, and the photo-spacer barrier layer commonly form the spaced pillar structure;
   in the bridge regions, the source-drain layer, the flat layer, the pixel definition layer, the photo-spacer barrier layer, and the cathode layer commonly form the bridging structure; and
   the cathode layer of the bridge regions and the anode layer of the display regions connect the anode layer of the pillar regions.

5. The deformable display panel as claimed in claim 4, wherein the source-drain layer and the anode layer are entirely in an inverted trapezoidal shape.

6. A manufacturing method for the deformable display panel as claimed in claim 1, wherein the deformable display panel comprises a plurality of display regions, a plurality of pillar regions, a plurality of bridge regions, and a plurality of aperture regions, wherein the pillar regions are disposed around the display regions, and the bridge regions are disposed between the aperture regions and the pillar regions or between the aperture regions; wherein the manufacturing method comprises steps of:

preparing a plurality of display units in the display regions;

preparing a plurality of spaced pillar structures in the pillar regions;

preparing a plurality of bridging structures in the bridge regions;

wherein the spaced pillar structures are disposed with and spaced apart from the display regions; the bridging structures are disposed with and spaced apart from the spaced pillar structures; the deformable display panel further comprises a plurality of signal lines connected from the bridge regions to the display units through the pillar regions.

7. The manufacturing method as claimed in claim 6, wherein the manufacturing method comprises steps of:

providing a base layer extended form the display regions to the aperture regions;

preparing a stretchable substrate extended from the display regions to the aperture regions;

preparing a barrier layer on the stretchable substrate, wherein the barrier layer extends from the display regions to the aperture regions;

preparing a buffer layer on the barrier layer, wherein the buffer layer extends from the display regions to the aperture regions;

preparing an active layer on the buffer layer of the display regions;

preparing a first gate insulating layer on the buffer layer, wherein the first gate insulating layer covers the active layer and extends from the display regions to the aperture regions;

preparing a first gate layer on the first gate insulating layer of the display regions;

preparing an interlayer dielectric layer on the gate insulating layer, wherein the interlayer dielectric layer covers the first gate layer and extends from the display regions to the aperture regions;

etching the first gate insulating layer and the interlayer dielectric layer of the pillar regions, the bridge regions, the aperture regions, and a part of the display regions, to form a plurality of through holes passed through the interlayer dielectric layer and the first gate insulating layer within the display regions;

etching the buffer layer of the pillar regions, the bridge regions, and the aperture regions;

preparing a source-drain layer in the through holes of the display regions and on the barrier layer of the pillar regions and the bridge regions, respectively, wherein the source-drain layers of the display regions, the pillar regions, and bridge regions are disposed with and spaced apart from each other;

etching the barrier layer and the stretchable substrate of the aperture regions;

preparing a flat layer on the interlayer dielectric layer of the display regions and on the barrier layer of the bridge regions, wherein the flat layer covers the source-drain layer of the bridge regions, and in the display regions, the flat layer has an opening corresponding to the source-drain layer;

preparing an anode layer on a surface of the flat layer of the display regions and on the source-drain layer of the pillar regions, wherein the anode layer extends into the opening and connects the source-drain layer;

preparing a pixel definition layer on the flat layer of the display regions, the pillar regions, and the bridge regions, and on the anode layer;

preparing a photo-spacer barrier layer on the pixel definition layer of the display regions, the pillar regions, and the bridge regions; and     etching a part of the source-drain layer and the anode layer of the pillar regions, so that the source-drain layer and the anode layer of the pillar regions are in an inverted trapezoidal shape.

8. The manufacturing method as claimed in claim 7, wherein a material of the barrier layer is silicon oxide, a material of the first gate insulating layer is silicon oxide or silicon nitride, a material of the gate layer is molybdenum metal, a material of the interlayer dielectric layer is silicon oxide and silicon nitride, a material of the source-drain layer is titanium metal or aluminum metal, a material of the flat layer and the pixel definition layer is photoresist, and the photo-spacer barrier layer and the pixel definition layer are prepared by a halftone mask process.

9. The manufacturing method as claimed in claim 7, wherein the manufacturing method further comprises steps of:

preparing an OLED light emitting layer on the anode layer of the display regions; and     preparing a cathode layer on the OLED light emitting layer of the display regions and on the photo-spacer barrier layer of the bridge regions.

10. A display device, comprising the deformable display panel as claimed in claim 1.

11. The display device as claimed in claim 10, wherein the display device comprises:

a base layer extended from the display regions to the aperture regions;

a stretchable substrate extended from the display regions to the bridge regions; and     a barrier layer disposed on the stretchable substrate and extended from the display regions to the bridge regions.

12. The display device as claimed in claim 11, comprising:

a buffer layer disposed on the barrier layer of the display regions;

an active layer disposed on the buffer layer of the display regions;

a first gate insulating layer disposed on the buffer layer of the display regions and covering the active layer;

a first gate layer disposed on the first gate insulating layer of the display regions;

an interlayer dielectric layer disposed on the first gate insulating layer of the display regions and covering the first gate layer; and     a plurality of through holes passed through the interlayer dielectric layer and the first gate insulating layer;

wherein the signal lines comprise a source-drain layer disposed on the interlayer dielectric layer and in the through holes and on the barrier layer of the pillar regions and the bridge regions.

13. The display device as claimed in claim 12, wherein the display device further comprises:

a flat layer disposed on the interlayer dielectric layer of the display regions and the barrier layer of the bridge regions, and covering the signal lines of the bridge regions, wherein in the display regions, the flat layer has an opening corresponding to the source-drain layer;

an anode layer disposed on a surface of the flat layer of the display regions and on the signal lines of the pillar regions, wherein the anode layer extends into the opening and connects the source-drain layer;

a pixel definition layer disposed on the flat layer of the display regions, the pillar regions, and the bridge regions, and on the anode layer;

a photo-spacer barrier layer disposed on the pixel definition layer of the display regions, the pillar regions, and the bridge regions; and an OLED light-emitting layer disposed on the anode layer of the display regions;

wherein the signal lines further comprise a cathode layer disposed on the OLED light-emitting layer of the display regions and on the photo-spacer barrier layer of the bridge regions;

in the display regions, the buffer layer, the active layer, the first gate insulating layer, the first gate layer, the interlayer dielectric layer, the source-drain layer, the flat layer, the anode layer, the pixel definition layer, the photo-spacer barrier layer, the OLED light-emitting layer, and the cathode layer commonly form the display units;

in the pillar regions, the source-drain layer, the anode layer, the pixel definition layer, and the photo-spacer barrier layer commonly form the spaced pillar structure;

in the bridge regions, the source-drain layer, the flat layer, the pixel definition layer, the photo-spacer barrier layer, and the cathode layer commonly form the bridging structure; and the cathode layer of the bridge regions and the anode layer of the display regions connect the anode layer of the pillar regions.

14. The display device as claimed in claim 13, wherein the source-drain layer and the anode layer are entirely in an inverted trapezoidal shape.

* * * * *